United States Patent [19]
Cutter et al.

[11] Patent Number: 5,982,656
[45] Date of Patent: Nov. 9, 1999

[54] METHOD AND APPARATUS FOR CHECKING THE RESISTANCE OF PROGRAMMABLE ELEMENTS

[75] Inventors: Douglas J. Cutter, Fort Collins, Colo.; Fan Ho, Sunnyvale, Calif.; Kurt D. Beigel, Bosie, Id.; Brett M. Debenham, Meridian, Id.; Dien Luong, Boise, Id.; Kim Pierce; Patrick J. Mullarkey, both of Meridian, Id.

[73] Assignee: Micron Technology, Inc., Boise, Id.

[21] Appl. No.: 08/813,767

[22] Filed: Mar. 7, 1997

[51] Int. Cl.⁶ ..................................... G11C 17/00

[52] U.S. Cl. .............................. 365/96; 365/201; 324/550

[58] Field of Search ................................. 365/96, 225.7, 365/203, 201; 327/525; 326/38; 324/550

[56] References Cited

U.S. PATENT DOCUMENTS

| 5,293,133 | 3/1994 | Birkner et al. ......................... 365/96 X |
| 5,414,364 | 5/1995 | McCollum ............................ 327/525 X |
| 5,469,396 | 11/1995 | Eltoukhy ................................ 365/96 X |
| 5,694,047 | 12/1997 | Goetting et al. ....................... 365/96 X |

*Primary Examiner*—Son Mai
*Attorney, Agent, or Firm*—Fletcher, Yoder & Van Someren

[57] ABSTRACT

Method and apparatus are disclosed for checking the resistance of programmable circuits in an integrated circuit where each programmable circuit includes a programmable element, such as an antifuse. A precharged node is connected to the programmable element and the voltage at the node discharges based on the resistance of the programmable element. An output signal is produced whose binary value is based on the voltage at the node after a sufficient time has elapsed to allow the initial voltage to discharge based on the resistance of the programmable element.

34 Claims, 5 Drawing Sheets

METHOD AND APPARATUS FOR CHECKING THE RESISTANCE OF PROGRAMMABLE ELEMENTS

CROSS-REFERENCE TO OTHER APPLICATIONS

Filed on the same date as this application is U.S. patent application of Don Morgan, Entitled: "SIMPLE FUSE MARGIN TEST CIRCUIT;" and U.S. patent application of Douglas J. Cutter, Adrian E. Ong, Fan Ho, Kurt D. Beigel, Brett M. Debenham, Dien Luong, Kim M. Pierce, and Patrick J. Mullarkey, Entitled: "METHOD AND APPARATUS FOR CHECKING THE RESISTANCE OF PROGRAMMABLE ELEMENTS."

BACKGROUND OF THE INVENTION

1. Field of the Invention

The present invention relates to integrated circuit products and, more particularly, to method and apparatus for verifying the programming of antifuse elements in integrated circuits.

2. Description of the Related Art

Contemporary memory products require a high degree of redundancy in order to improve manufacturing yields. Present redundancy techniques in memory products include providing extra memory array columns and/or extra memory array rows which can be used to replace defective columns and/or rows.

Antifuses have been used as nonvolatile programmable memory elements to store logic states for implementing row and column redundancy in DRAMs. When used for redundancy implementation, antifuses are usually constructed in the same manner as the memory cell capacitors in the DRAM array. However, antifuses have other uses in memory products besides redundancy implementation. Antifuses may, for example, be used in integrated circuit memory as a mechanism for changing the operating mode of the memory or may be programmed to encode identification information about the memory, e.g., fabrication date.

An antifuse is, by definition, a two-terminal device which functions as an open circuit until programmed. Ideal programming of an antifuse results in a permanent short circuit existing between the two terminals. However, programming usually results in a resistance existing between the two terminals. The magnitude of this resistance is an indicator of whether the antifuse was successfully programmed.

Determining the resistances of antifuses in a DRAM has traditionally been accomplished by placing a DRAM in an automated circuit testing device (commonly referred to as Automated Test Equipment or ATE) and measuring the resistance of each antifuse parametrically. The measurement procedure involves physically measuring the current draw through each antifuse using a prober or similar measurement instrument. The process of measuring the current draw of individual antifuses requires placement of the probe and generation of several signals to and from the ATE. Even with the speed and sophistication of existing probers, the procedure routinely consumes 10 to 20 milliseconds per antifuse.

In a past era, when 4 Megabit DRAMs represented the leading edge in DRAM sophistication, measurement times of 10 to 20 milliseconds per antifuse yielded acceptable economics for manufacturers. This was due to the relatively small number of antifuses per DRAM (approximately 20). However, the number of antifuses in a typical DRAM has increased dramatically as the circuit density of DRAMs has increased. Whereas a 4 Megabit DRAM may contains approximately 20 antifuses, a 64 Megabit DRAM may have approximately 640 antifuses, and a 256 Megabit DRAM some 5000 or more. The time required to measure the antifuse programming for such higher density DRAMs using conventional parametric methods represents a significant strain on manufacturing efficiency.

SUMMARY OF THE INVENTION

In accordance with one aspect of the present invention, a method of checking the resistance of a programmable circuit in an integrated circuit is provided. The method includes the steps of precharging a node to an initial voltage and connecting the programmable circuit to the node. An output signal is generated whose binary value is based on the voltage that exists at the node after the programmable circuit is connected to the node.

In accordance with another aspect of the present invention, an apparatus for checking the resistance of a programmable circuit in an integrated circuit is provided. The apparatus includes circuitry defining a programmable circuit. The circuitry includes a programmable element that has a resistance. Circuitry for precharging a node to an initial voltage is provided as well as circuitry for connecting the programmable element in series with the precharged node. There is also circuitry which generates an output signal whose binary value is based on the voltage in the node after the programmable element is connected to the node.

In accordance with still another aspect if the present invention, an apparatus for checking the resistance of a programmable element in an integrated circuit is provided. The apparatus includes means for precharging a node to an initial voltage, means for connecting the programmable element to the node, and means for generating an output signal whose binary value is based on the voltage that exists at the node after the programmable element is connected to the node.

In accordance with a yet another aspect of the present invention, an integrated circuit is provided. The integrated circuit includes a plurality of programmable circuits. Each programmable circuit has a programmable element that has a resistance. A decoder is provided for decoding a first address signal and sending a first enabling signal to each of the plurality of programmable circuits to selectively connect each programmable circuit to a node. A precharged circuit for precharging the node to an initial voltage is included. An output signal generator is provided for generating an output signal whose binary value is based on the voltage in the node after a given programmable is circuit is connected to the node.

In accordance with still another aspect of the present invention, a semiconductor memory device is provided. The memory device includes a memory array and a plurality of programmable circuits. Each programmable circuit has a programmable element that has a resistance. Means for precharging a node to an initial voltage is provided, as well as means for connecting each programmable circuit to the node. In addition, means is provided for generating an output signal whose binary value is based on the voltage that exists at the node after a given programmable circuit is connected to the node.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
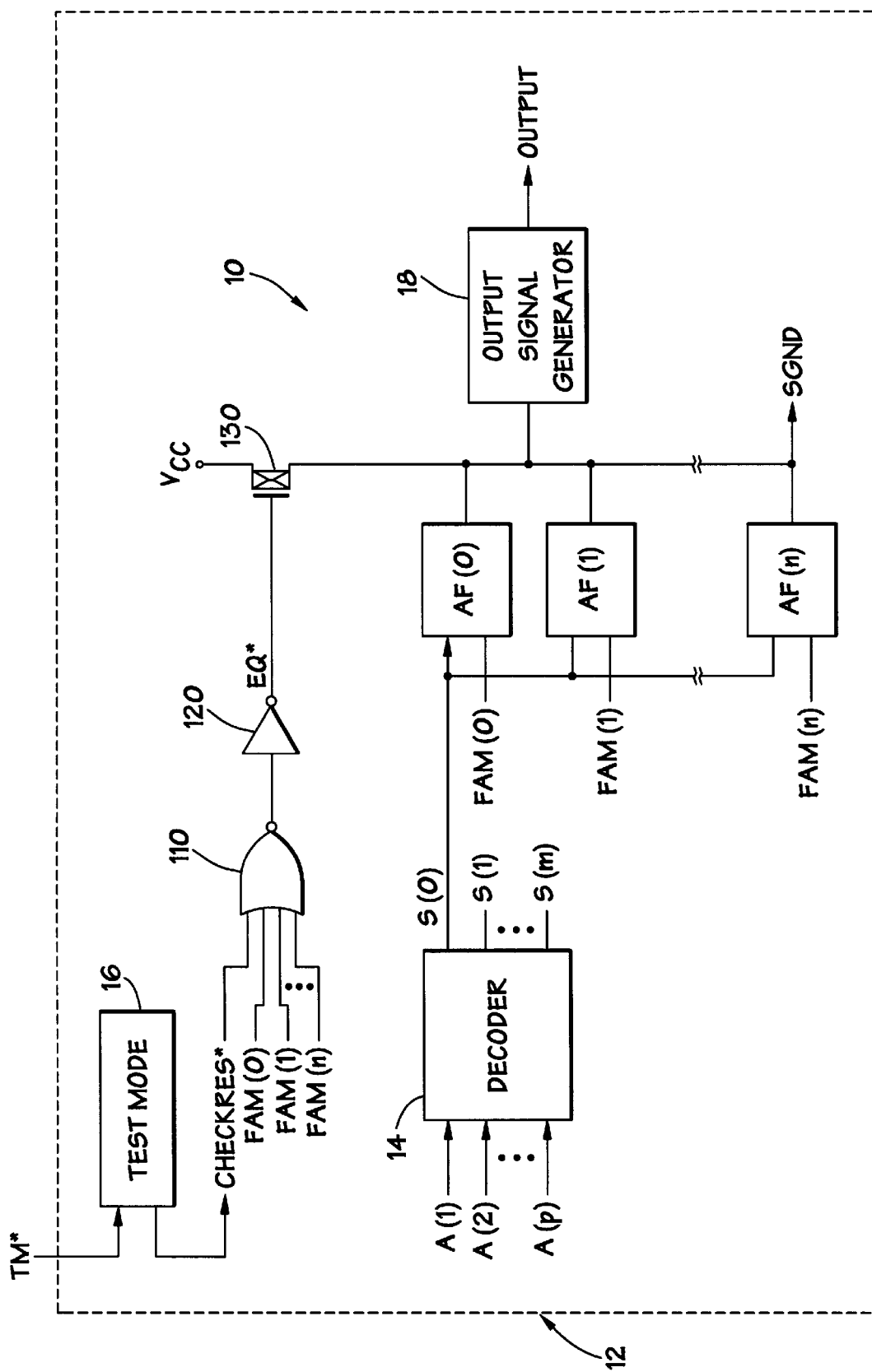
FIG. 1 is a schematic diagram in block diagram form of one embodiment of apparatus in accordance with the present invention.

Referring first to FIG. 1, an apparatus 10 for testing the resistance of programmable elements in an integrated circuit 12 in accordance with the present invention is depicted. The apparatus 10 is designed to receive various activation and address signals from an external test apparatus (not shown), such as, for example, a piece of automated test equipment (ATE). The apparatus 10 includes an address decoder 14, a test mode circuit 16, a plurality of programmable circuits AF(i), where i=0, 1, 2 . . . n, and an output signal generator 18. The invention is described herein using antifuses as an example of a programmable circuit. However, the skilled artisan should appreciate that the following description is applicable to resistance measurement of fuses, antifuses, ovonic devices, or like programmable circuits. The outputs of the antifuses AF(i) are commonly connected to the output signal generator 18.

Figure 2:
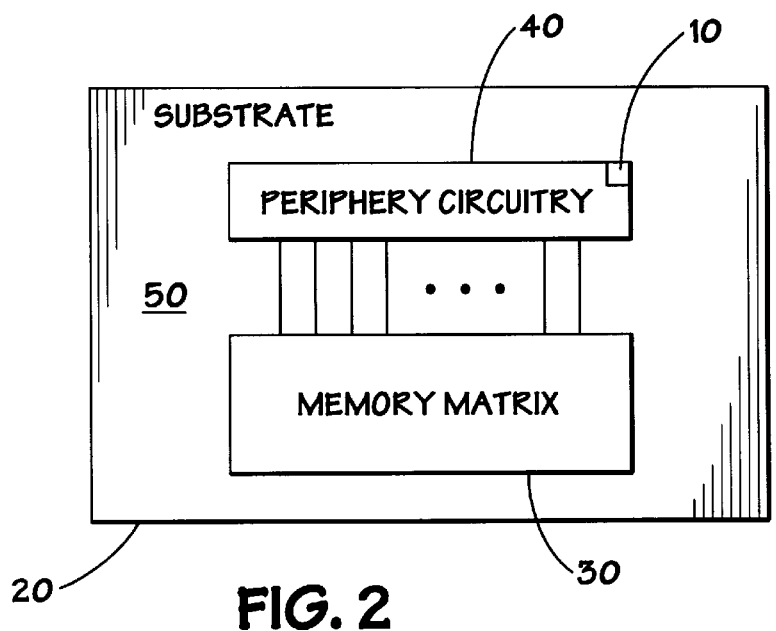
FIG. 2 is a schematic diagram in block diagram form of the apparatus of FIG. 1 incorporated into a memory device.
Figure 3:
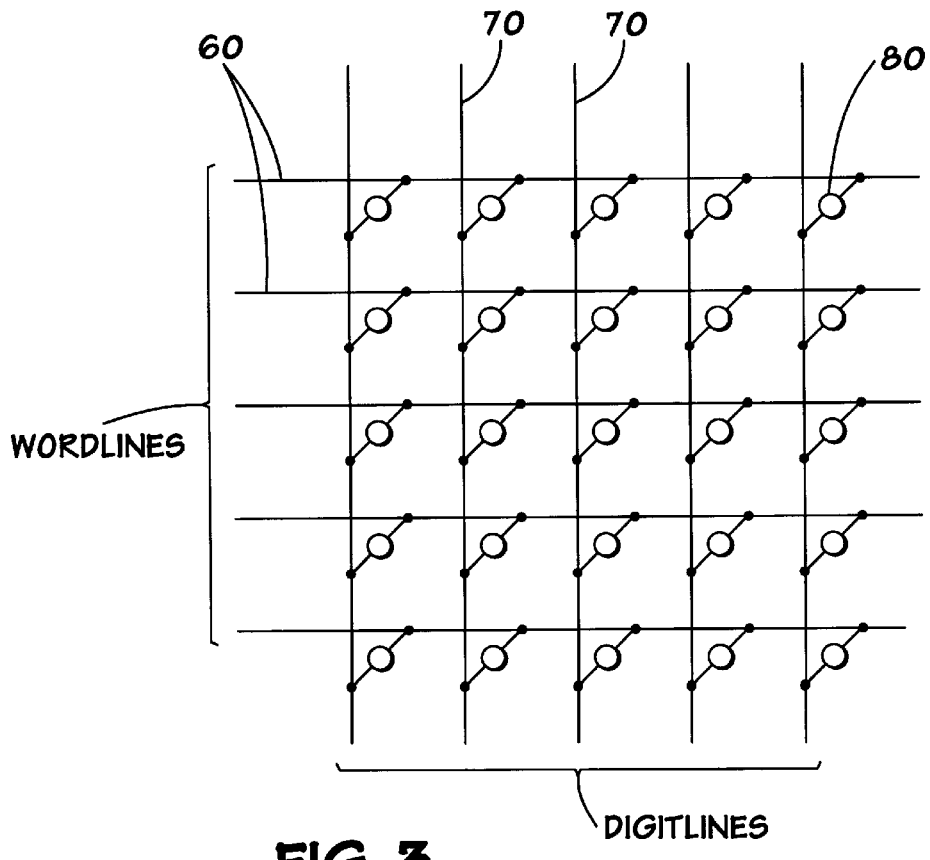
FIG. 3 is a schematic diagram of a portion of the memory device of FIG. 3.

As shown in FIG. 2, the integrated circuit 12 may be a semiconductor memory device 20 as shown in FIG. 2. The memory device 20 includes a memory array 30 and associated periphery circuitry 40 disposed on a semiconductor substrate 50. The memory array 30 consists of a plurality of rows of wordlines 60 criss-crossed by a plurality of columns of digitlines 70 as shown in FIG. 3. The wordlines 60 and the digitlines 70 connect to a plurality of memory cells 80. Just a small portion of the memory array 30 is shown in FIG. 2.

The antifuses AF(i) in the semiconductor device 12 are arranged in a number of banks, and one such bank AF(0) . . . AF(n) is shown in FIG. 1. A particular one of the banks of antifuses is selected during a resistance checking process by activating the enabling signal S(i), i=0, 1, 2 . . . m for that bank via the ATE. By way of illustration, the bank of antifuses shown in FIG. 1 is selected by bank select signal S(0). The S(i) signals may, for example, correspond to memory row address signals A(0), A(1) . . . A(p) received from the ATE, which are decoded by the decoder 14.

A particular antifuse within the selected bank is selected during a resistance checking process by activating the enabling signals FAM(k), k=0, 1, 2 . . . n for that particular antifuse element via the ATE. The FAM(k) signals may, for example, correspond to memory column address signals FAM(0), FAM(1) . . . FAM(n) received from the ATE. The sequential addressing of each antifuse within the bank, e.g. the sequential enabling of signals FAM(k), is accomplished by toggling a signal CAS, which is generated by the ATE.

In addition to forming one of the inputs to the antifuses AF(i), the FAM(k) signals feed a NOR gate 110, along with a resistance check enabling signal, CHECKRES*. The CHECKRES* signal is generated by the test mode circuit 16. The test mode circuit 16 is enabled, and the apparatus 10 is placed in a test mode by an enabling signal TM*, which is ordinarily a high voltage signal provided by the ATE.

The output of the NOR gate 110 is serially connected to an inverter 120, which is connected to the gate of a p-channel transistor 130. The p-channel transistor 130 serves as a precharge transistor, the source of which is connected to Vcc. A signal EQ* is generated at the output of the inverter 120.

Figure 4:
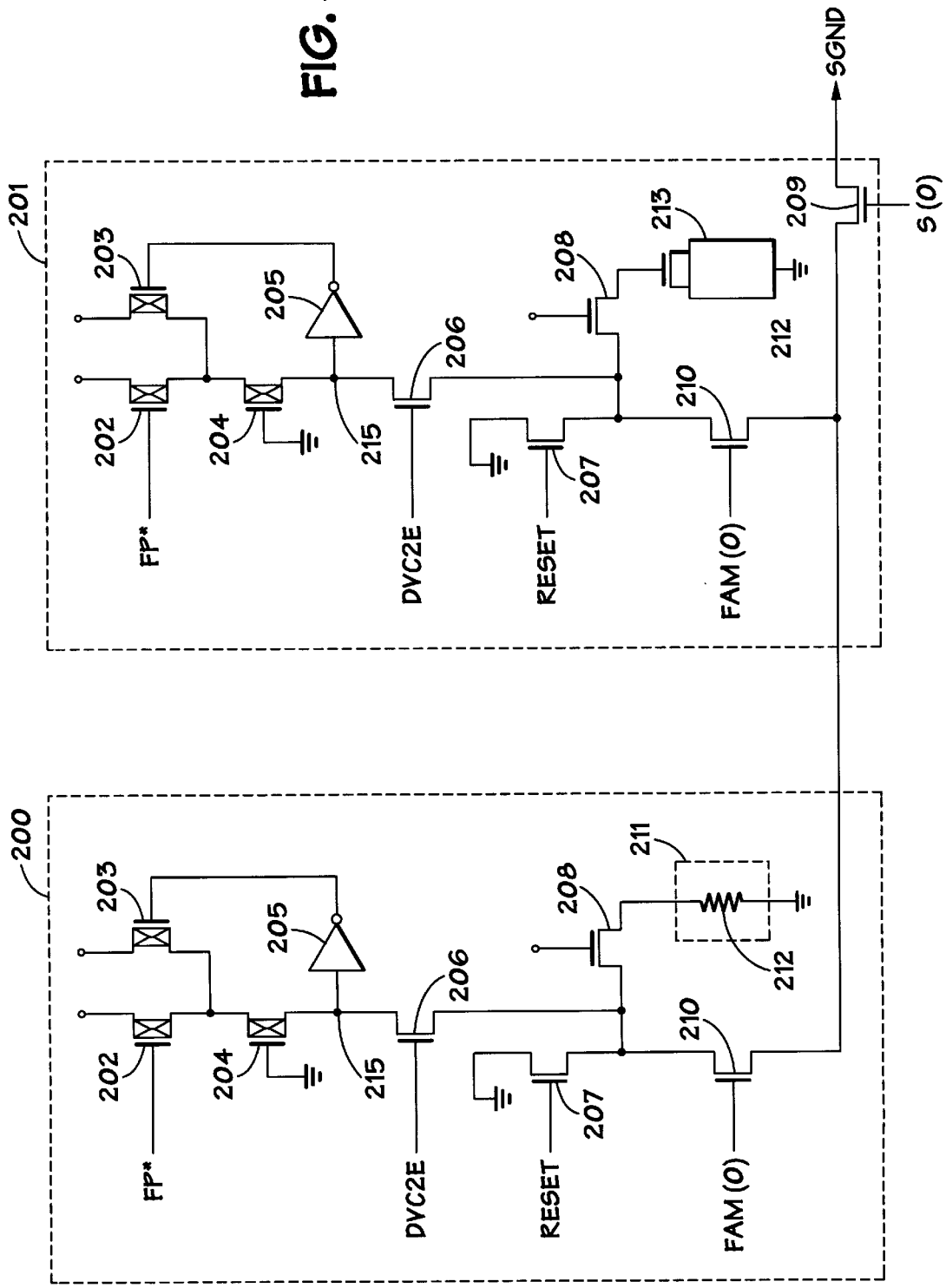
FIG. 4 is a schematic diagram which illustrates two of the antifuse elements of FIG. 1.

With reference now to FIG. 4, the schematic circuits of two antifuses AF(0) and AF(1) are illustrated. Each antifuse AF(0) and AF(1) includes p-channel transistors 202–204, an inverter 205, n-channel transistors 206–210, and respective programmable or antifuse elements 211 and 213 all connected as shown. In addition, the antifuses AF(0) and AF(1) have an n-channel transistor 209 gated to the bank select signal S(0). All of the antifuses AF(i) in a given bank are commonly connected to the source of the transistor 209 such that when S(0) is high a pathway to ground is established for a given selected antifuse AF(i). The antifuse element 211 in the antifuse AF(0) has been programmed and has resistance between its terminals. The antifuse element 213 in the antifuse AF(1) is unprogrammed. A signal DVC2E is applied to the gate of n-channel transistor 206. The signal DVC2E is generated internally in the integrated circuit 12 and has a voltage approximately equal to Vcc/2, e.g., +1.5 volts for a 3.3 volt part. The transistor 207 is gated to a RESET signal that is generated by the test mode circuit 16. Before a particular antifuse, such as AF(0), is programmed, RESET is set high to ensure there is no charge on the antifuse element 211 prior to programming.

In an embodiment, the width to length ratio (W/L) of the transistors in each antifuse AF(0) and AF(1) are as follows: (a) transistors 202 and 203: 16/4; (b) transistor 204: 16/300; (c) transistor 206: 40/4; (d) transistor 207: 40/6; and (e) transistors 208–210: 242/5. The p-channel transistor in inverter 205 has a W/L ratio of 40/6 and the n-channel transistor in the inverter 205 has a W/L ratio of 40/4.

The p-channel transistors 202, 203, and 204, in conjunction with the inverter 205, form a latch node 215 that is designed to match the logic state of the antifuse element 211 or 213, e.g., programmed or unprogrammed. As discussed below, when the semiconductor device 12 is in an antifuse resistance checking mode, the latch node 215 is isolated from the antifuse element 211 or 213 by the transistor 206. However, when the semiconductor device 12 is in a normal operating mode, the latch node 215 is designed to deliver current to an unprogrammed antifuse element, such as antifuse element 213 and, conversely, to withhold current from a programmed antifuse element, such as antifuse element 211.

The signal FP* is used to initialize the latch prior to the programming of an antifuse element and to reinitialize the latch after the programming of an antifuse element. To explain, first assume that the antifuse element 213 has not been programmed. When the signal FP* received by the gate of the transistor 202 transitions from a logical 1 to a logical 0, the transistor 202 turns on. The gate of the transistor 204 is biased on, so that the transistor 204 provides a load or resistance. Therefore, the latch node 215 receives a logical 1. Because the inverter 205 outputs a logical 0, it turns on the transistor 203. Thus, even when the signal FP* transitions back to a logical 1, the transistor 203 maintains the latch node 215 at a logical 1.

Now assume that the antifuse element 211 has been programmed. When the signal FP* received by the gate of the transistor 202 transitions from a logical 1 to a logical 0, the transistor 202 turns on. The gate of the transistor 204 is biased on, so that the transistor 204 provides a load or resistance. However, instead of the latch node 215 receiving a logical 1, the charge dissipates to circuit ground through the programmed antifuse 211. Therefore, the latch node 215 returns to a logical 0. Because the inverter 205 outputs a logical 1, it turns off the transistor 203. Thus, even when the signal FP* transitions back to a logical 1, both of the transistors 202 and 203 remains off, and the latch node 215 remains at a logical 0.

As a result of commonly encountered manufacturing process variations, there may be variations in the resistances of the antifuse elements 211 and 213 after programming. If the resistance of a given antifuse element, such as 211, is close enough to, or greater than the resistance of the transistor 204, there is the possibility that the inverter 205 will read the antifuse element 211 as unprogrammed and latch high. To guard against this potential device conflict, the transistor 204 should have resistance that is considerably greater than the anticipated maximum resistance of the programmed antifuse element 211.

Figure 5:
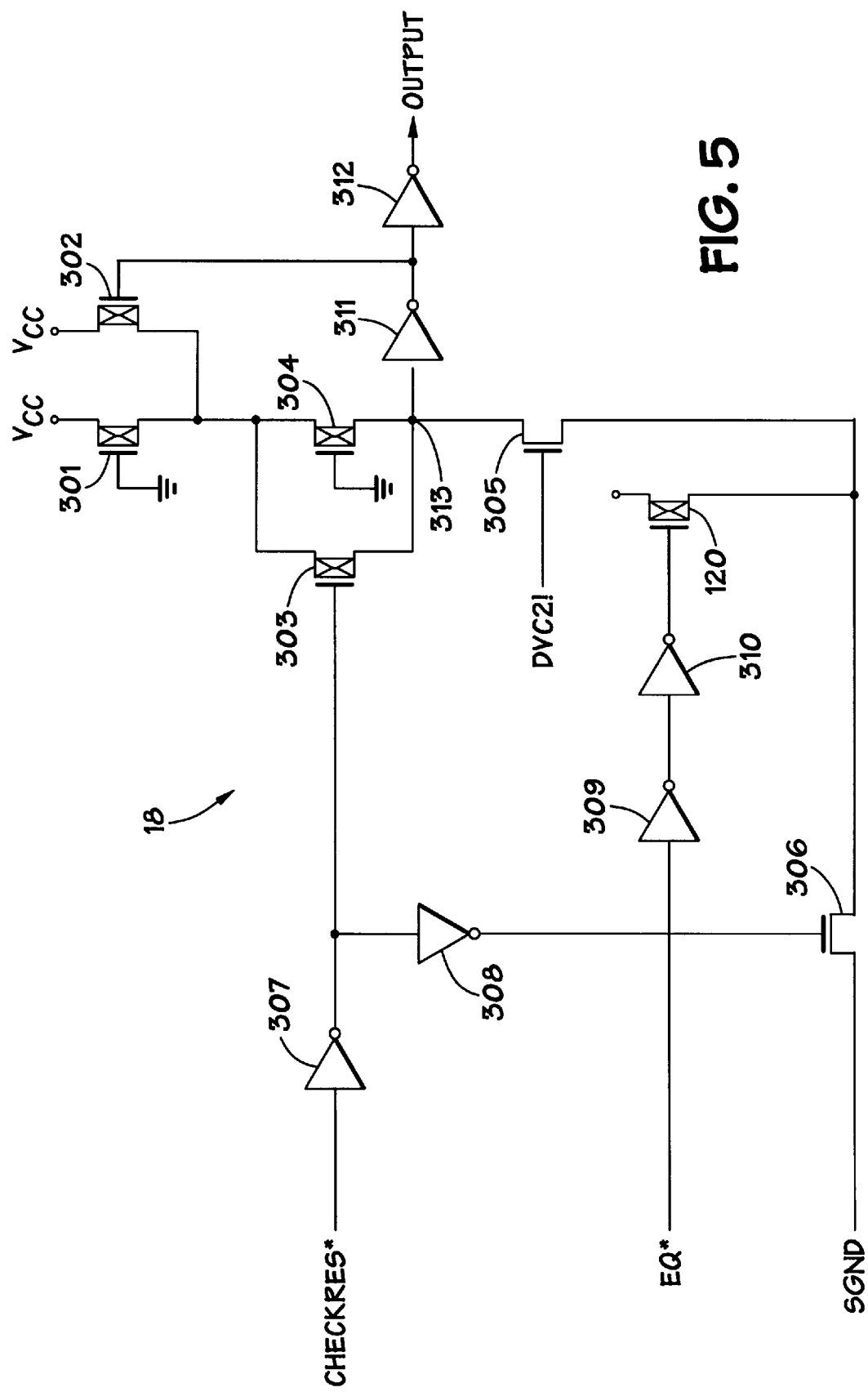
FIG. 5 is a schematic diagram which illustrates an embodiment of the output signal generator of FIG. 1.
Figure 6:
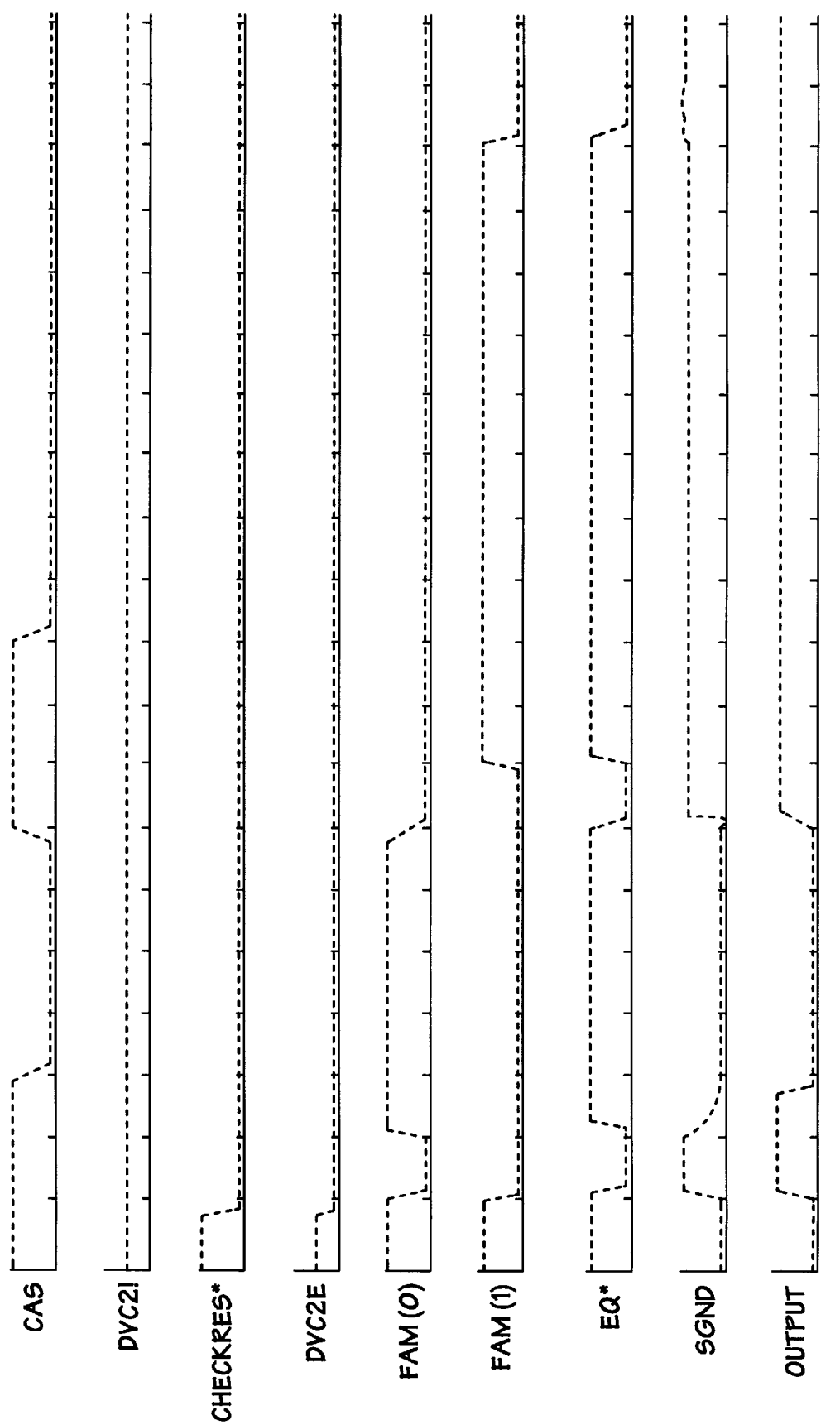
FIG. 6 is a timing diagram which illustrates timing relationships of signals used in the preferred embodiment of the present invention.

With reference now to FIG. 5, there is illustrated an embodiment of the output signal generator 18 of FIG. 1. The output signal generator 18 includes p-channel transistors 301–304, n-channel transistors 305-06, and inverters 307–311, all connected as shown. The signal DVC2! gated to the transistor 305 is a voltage which is generated internally by the semiconductor device 12 and has a magnitude of approximately Vcc/2, e.g., +1.5 volts for a 3.3 volt part.

The width to length (W/L) ratio of the transistors 301–06 are as follows: (a) transistor 301 and 302:4/1; (b) transistor 303:4/25; (c) transistor 304:4/90; (d) transistor 305:10/1; (e) transistor 130:40/1; and (f) transistor 306:60/1. The W/L ratio of the p-channel transistors in the inverters 307, 308, and 309 is advantageously 15/1, and the W/L ratio of the n-channel transistor in the inverter 307 is advantageously 10/1. The W/L ratio of the p-channel transistor in the inverter 310 is advantageously 45/1, and the W/L ratio of the n-channel transistor in the inverter 310 is advantageously 30/1. The W/L ratio of the p-channel transistor in the inverter 311 is advantageously 10/1.5, and the W/L ratio of the n-channel transistor in the inverter 311 is advantageously 4/1. The W/L ratio of the p-channel transistor in the inverter 312 is advantageously 75/1, and the W/L ratio of the n-channel transistor in the inverter 312 is advantageously 50/1.

The operation of an embodiment of the apparatus 10 in accordance with the present invention is now described with reference to FIGS. 1, and 4–6. A resistance checking process is commenced when the test mode circuit 16 receives the enabling signal TM*. The signal CHECKRES* is traversed from a logic 1 to a logic 0. By manipulating the ATE, all of the FAM(k), k=1, 2 . . . n selection signals are also brought to a logic zero state. The signal EQ* under these conditions traverses from a logic 1 to a logic 0 and the precharge transistor 120 is enabled. The node designated SGND is charged to the supply voltage Vcc, e.g., +3.3 volts at this time.

When CHECKRES* is traversed to a logic zero: (a) the signal DVC2E traverses to a logic 0, thereby disabling the transistor 206 in each antifuse AF(i); and (b) the p-channel transistor 303 is disabled, which allows the node 313 to charge to a voltage approximately equal to Vcc less the voltage drops across the transistors 301 and 304.

Assume that the resistance of antifuse element AF(0) of FIG. 1 is to be checked. The CHECKRES* signal and the selection signals S(0) and FAM (0) are set high, providing the node 313 with a current path to ground through the programmed antifuse element 211. If the antifuse element 211 is properly programmed the voltages at the nodes 313 and SGND will discharge sufficiently such that the voltage at the node 313 will be detected as a logic 0 and the OUTPUT will be low. However, if the antifuse element 211 is improperly programmed or not programmed at all, the resistance between its two terminals will be sufficiently high such that the precharged voltages at the node SGND and the node 313 will not discharge a sufficient amount to enable the inverter 311 to detect the voltage at the node 313 as a logic 0. The signal OUTPUT in such situations will remain a logic 1.

The inverter 307 is configured to discriminate between a voltage at the node 313 that represents an improperly programmed antifuse and a voltage at the node 313 that indicates a properly programmed antifuse. In this regard, the inverter 307 is designed to detect as a logic zero those voltages at the node 313 that fall below a predetermined threshold level (indicating an improperly programmed antifuse) and to detect as a logic 1 those voltages that fall above that predetermined threshold level (indicating a properly programmed antifuse). The choice of the predetermined threshold voltage level or trip point for discriminating between proper and improper antifuse programming will depend on the particular integrated circuit involved and will be a matter design discretion.

The skilled artisan will appreciate that it is desirable to set the threshold resistance of a given antifuse AF(i) that will be read by the inverter 311 as reflecting a programmed antifuse. For example, if the resistance of the antifuse element 211 after programming is very close to, or greater than, the resistance of the transistor 303, the inverter 311 may erroneously read the antifuse element 211 as unprogrammed. To avoid this potential device conflict, the p-channel transistor 303 is fabricated with length that provides a known, minimum resistance that will be read as an unprogrammed antifuse. This minimum resistance will normally be lower than the resistance of the transistor 301. Although the transistor 303 is used to provide the known minimum resistance, a resistive element may be used as well.

If it is desired to check the resistance of the antifuse AF(1), the antifuse AF(1) is selected by swinging signals S(0), FAM (1), and CAS high. The unprogrammed antifuse element 213 will then be connected in series with node SGND. In this instance, the voltage at node SGND has no path to discharge to ground and hence remains at the supply voltage to which it was precharged. Similarly, the voltage at node 313 remains equal to the supply voltage in this instance since it likewise has no discharge path to ground. In such a situation, the signal OUTPUT is a logic 1.

Although particular detailed embodiments have been described herein, it should be understood that the invention is not restricted to the details of the disclosed embodiments, and many changes in design, configuration, and dimensions may be possible without departing from the spirit and scope of the invention as defined by the appended claims.

What is claimed is:

1. A method of checking the resistance of a programmable circuit in an integrated circuit, comprising the steps of:
   precharging a node to an initial voltage;
   connecting said programmable circuit to said node; and
   generating an output signal whose binary value is based on the voltage that exists at said node after said programmable circuit is connected to the node.

2. Apparatus for checking the resistance of a programmable circuit in an integrated circuit, comprising:
   circuitry defining a programmable circuit, said circuitry including a programmable element having a resistance;
   circuitry for precharging a node to an initial voltage;
   circuitry for connecting the programmable element in series with said precharged node; and
   circuitry which generates an output signal whose binary value is based on the voltage in said node after said programmable element is connected to said node.

3. The apparatus of claim 2, wherein said programmable element comprises an antifuse element.

4. The apparatus of claim 2, wherein said programmable element comprises an ovonic element.

5. The apparatus for checking the resistance of a programmable element in an integrated circuit, comprising:
   means for precharging a node to an initial voltage;
   means for connecting said programmable element to said node; and
   means for generating an output signal whose binary value is based on the voltage that exists at said node after the programmable element is connected to said node.

6. The apparatus of claim 5, wherein said programmable element comprises an antifuse element.

7. The apparatus of claim 5, wherein said programmable element comprises an ovonic element.

8. An integrated circuit, comprising:
   a plurality of programmable circuits, each programmable circuit having a programmable element with a resistance;
   a decoder for decoding a first address signal and sending a first enabling signal to each of said plurality of programmable circuits to selectively connect each programmable circuit to a node;
   a precharged circuit for precharging said node to an initial voltage; and
   an output signal generator for generating an output signal whose binary value is based on the voltage in said node after a given programmable circuit is connected to said node.

9. The apparatus of claim 8, wherein said programmable element comprises an antifuse element.

10. The apparatus of claim 8, wherein said programmable element comprises an ovonic element.

11. A semiconductor memory device, comprising:
   a memory array;
   a plurality of programmable circuits, each programmable circuit having a programmable element with a resistance;
   means for precharging a node to an initial voltage;
   means for connecting each programmable circuit to said node; and
   means for generating an output signal whose binary value is based on the voltage that exists at said node after a given programmable circuit is connected to said node.

12. The apparatus of claim 11, wherein said programmable element comprises an antifuse element.

13. The apparatus of claim 11, wherein said programmable element comprises an ovonic element.

14. The integrated circuit of claim 8, wherein the precharged circuit comprises:
   a test mode circuit for placing the integrated circuit in a test mode.

15. The integrated circuit of claim 14, wherein the test mode circuit generates a resistance check enabling signal in response to receiving a test mode signal.

16. The integrated circuit of claim 15, wherein the precharged circuit comprises a logic gate coupled to receive the resistance check enabling signal and a plurality of element selection signals, the logic gate delivering a signal to precharge the node in response to receiving at least the resistance check enabling signal.

17. The integrated circuit of claim 16, wherein each of the element selection signals are also delivered to each of the programmable circuits to selectively couple one of the programmable elements of each programmable circuit to the node for testing.

18. The integrated circuit of claim 17, wherein the test mode signal and the element selection signals are generated by automated test equipment.

19. The integrated circuit of claim 8, wherein the output signal generator comprises:
   circuitry which detects a voltage across each selected programmable element and determines whether the detected voltage exceeds a threshold level to discriminate between a properly programmed programmable element and an improperly programmed programmable element.

20. A method of checking the resistance of a plurality of programmable circuits in an integrated circuit, comprising the steps of:
   precharging a node to an initial voltage;
   selectively connecting one of the plurality of programmable circuits to the node; and
   generating an output signal whose binary value is based on the voltage that exists at the node after the programmable circuit is connected to the node.

21. The method of claim 20, wherein the step of precharging comprises the step of placing the integrated circuit into a test mode.

22. The method of claim 20, wherein the step of selectively connecting comprises the step of selectively coupling a programmable element of the selected programmable circuit to the node for testing.

23. Apparatus for checking the resistance of a programmable circuit in an integrated circuit, comprising:
   a plurality of programmable circuits, each programmable circuit comprising a programmable element;
   a precharging circuit coupled to a node, the precharging circuit charging the node to an initial voltage;
   a selection circuit coupled to each of the plurality of programmable circuits, the selection circuit being operable to select one of the plurality of programmable circuits to couple the programmable element of each selected programmable circuit in series with the node; and
   an output circuit which generates a binary output signal whose binary value is based on the voltage of the node after the programmable element is connected to the node.

24. The apparatus of claim 23, wherein the programmable element comprises an antifuse element.

25. The apparatus of claim 23, wherein the programmable element comprises an ovonic element.

26. An apparatus for checking the resistance of a plurality of programmable circuits in an integrated circuit, comprising:
   means for precharging a node to an initial voltage;
   means for selectively operably coupling one programmable circuit at a time to the node; and
   means for generating a binary signal whose binary value is based on the voltage that exists at the node after the programmable circuit is operably coupled to the node.

27. The apparatus of claim 26, wherein each programmable circuit comprises a plurality of programmable elements, and wherein the coupling means comprises means for selectively coupling one of the plurality of programmable elements of the selected programmable circuit to the node.

28. An integrated circuit, comprising:

a plurality of programmable circuits, each programmable circuit having at least one programmable element;

a decoder for decoding a first address signal and sending a first enabling signal to each of the plurality of programmable circuits to selectively couple each programmable circuit to a node;

a precharging circuit for precharging the node to an initial voltage; and an output signal generator for generating an output signal having a voltage correlative to a voltage on the node after a given programmable circuit is coupled to the node.

29. The apparatus of claim 28, wherein the programmable element comprises an antifuse element.

30. The apparatus of claim 28, wherein the programmable element comprises an ovonic element.

31. A method of determining the states of a plurality of programmable circuits on an integrated circuit, the integrated circuit also comprising a decoder, a precharging circuit, and an output signal generator, the method comprising the steps of:

coupling automated test equipment to the integrated circuit;

placing the integrated circuit into a test mode;

charging a node to an initial voltage using the precharging circuit in response to the integrated circuit being placed in the test mode;

generating a first address signal using the automated test equipment and delivering the first address signal to the decoder;

decoding the first address signal using the decoder, the decoder delivering an enable signal to a selected one of the plurality of programmable circuits to operably couple the selected programmable circuit to the node; and delivering an output voltage signal using the output signal generator, the output voltage signal having a value correlative to a voltage at the node after the selected programmable circuit is operably coupled to the node.

32. The method of claim 31, wherein the step of placing comprises the step of:

generating a test mode initiation signal using the automated test equipment to place the integrated circuit into the test mode.

33. The method of claim 31, wherein the step of generating comprises the step of:

generating a second address signal using the automated test equipment and delivering the second address signal to a plurality of programmable elements in the selected programmable circuit, the second address signal selectively coupling one of the plurality of programmable elements to the node.

34. The method of claim 31, wherein the step of delivering the output signal comprises the step of:

delivering a binary signal having a binary value indicative of the state of the selected programmable circuit.

* * * * *